United States Patent
Saeki

[11] Patent Number: 6,016,064
[45] Date of Patent: Jan. 18, 2000

[54] INTERPOLATING CIRCUIT

[75] Inventor: Takanori Saeki, Tokyo, Japan

[73] Assignee: NEC Corporation, Tokyo, Japan

[21] Appl. No.: 09/038,971

[22] Filed: Mar. 12, 1998

[30] Foreign Application Priority Data

Mar. 13, 1997 [JP] Japan .................................. 9-058749

[51] Int. Cl.⁷ .................. H03K 19/094; H03K 19/0175; H03K 19/01
[52] U.S. Cl. ............................. 326/121; 326/121; 326/83; 326/17
[58] Field of Search ................................... 326/121, 119, 326/120, 17, 122, 26, 27

[56] References Cited

U.S. PATENT DOCUMENTS 5,629,638  5/1997  Kumar ..................................... 326/121

FOREIGN PATENT DOCUMENTS

| | | |
|---|---|---|
| 59-23925 | 2/1984 | Japan . |
| 2-402087820 | 3/1990 | Japan . |
| 4-156008 | 5/1992 | Japan . |
| 5-405175826 | 7/1993 | Japan . |
| 7-131335 | 5/1995 | Japan . |

*Primary Examiner*—Michael Tokar
*Assistant Examiner*—Vibol Tan
*Attorney, Agent, or Firm*—Sughrue, Mion, Zinn Macpeak & Seas, PLLC

[57] ABSTRACT

There is a parallel-connected circuit of a first PMOS transistor P1 having its gate connected to a first input terminal IN1 and a second PMOS transistor P2 having its gate connected to a second input terminal IN2, and a first series-connected circuit of a first NMOS transistor N1 having its gate connected to the first input terminal IN1 and a second NMOS transistor N2 having its gate connected to the second input terminal IN2, and there is a second series-connected circuit of a third PMOS transistor P3 having its gate connected to the first input terminal IN1 and a fourth PMOS transistor P4 having its gate connected to the second input terminal IN2, which is provided between the first power supply and output terminal, this being connected in parallel with the parallel-connected circuit of the first PMOS transistor P1 and the second PMOS transistor P2.

9 Claims, 8 Drawing Sheets

INTERPOLATING CIRCUIT

BACKGROUND OF THE INVENTION

1. Field of the Invention

The present invention relates to a interpolating circuit and more specifically to a circuit which is used for the purpose of interpolating such signals as the output signal from a synchronization delay circuit. Further the present invention relates to circuit in which so called cycle dependency of the delay time with respect to an external clock when an internal clock is obtained from the external clock, is eliminated.

2. Description of Related Art

In the past, PLLs (phase-locked loops) and DLLs (delay-locked loops) were used in applications such as phase adjustment of an internal clock with respect to an external clock of a synchronous DRAM, and these circuits, being basically feedback control systems, require several tens or even several hundreds of clocks before achieving the locked condition, this representing the problem of a lengthened period in which operation is unstable. Although several types of synchronization delay circuits have been proposed to accommodate this problem, these circuits are all based on a digital delay circuit, making the resolution thereof dependent upon the delay of the unit-delay circuit, this causing a phase error. However, it is possible to improve the resolution and reduce the phase error by providing two (or four or eight and so on) synchronization delay circuits having a delay time of ½ (or ¼ or ⅛ and so on) of the unit delay.

FIG. 6 is a block diagram which shows a synchronization delay circuit having a interpolating circuit, which was proposed in the Japanease Patent Application H8-243022. The multiple synchronization delay circuit in this prior art has input delay circuits 101AA and 101BA, which have differing delay times, output delay circuits 102AA and 102BA, which have differing delay times, first and second synchronization delay circuits 100A and 100B which successively output a delay signal, a interpolating circuit 100C, which generates internal clock by performing logical operations on each of the delay signals input thereto, a receiving circuit 105, a first delay circuit 107, a second delay circuit 108, and an amplifier circuit 106.

The receiving circuit 105 receives an external clock as an input signal and serves the function of generating a pulse of a prescribed pulse width. The output signal of the receiving circuit 105 passes through the first delay circuit 107 and then the second delay circuit 108, the output signal of which is input to the input delay circuits 101AA and 101BA, respectively, of the first and second synchronization delay circuit 100A and 100B, and the output signal of the receiving circuit 105 is also input to the control signal lines 109A and 109B, respectively, of the first and second synchronization delay circuits 100A and 100B. The output signals from the first and second synchronization delay circuits 100A and 100B are input to a interpolating circuit 100C, the output signal from which is input to the amplifier circuit 106.

The first synchronization delay circuit 100A and the second synchronization delay circuit 100B have almost the same configuration. That is, the first synchronization delay circuit 101A and the second synchronization delay circuit 100B have the same configuration, with the only exception being the fact that the delay times of the input delay circuit 101AA and the input delay circuit 101BA mutually differ. Therefore, while the description to follow will chiefly describe the internal configuration and operation of the first synchronization delay circuit 100A, the same understanding should be had with regard to the second synchronization circuit 100B.

The first synchronization delay circuit 100A has an input delay circuit 101AA which adjusts the delay time difference between the input signals of the first and second synchronization delay circuits, a detection delay circuit chain 101A that is formed by a cascade connection of a plurality of gate stages that successively delays the output signal from the input delay circuit 101AA as they transmit this signal, a control circuit 103A transmits the outputs of each stage of the detection delay circuit chain 101A in parallel to the transfer delay circuit chain 102A in synchronization with a pulse signal input to the control circuit line 109A, a transfer delay circuit chain 102A, which is formed by a plurality of cascade connected gate stages arranged so that the signal transmission path direction is opposite that of the detection delay circuit chain 101A, which receives at each of its gate stages inverted versions of each of the signals output in parallel from the control circuit 103A, and which successively delays them as they are transmitted, an output delay circuit 102AA which adjusts the delay time of the output signals of the transfer delay circuit chain 102A, and a load adjustment element 104A for the purpose of aligning together the delay times of each unit delay circuit of the transfer delay circuit chain 102A to the delay times of each unit delay circuit of the detection delay circuit chain 101A.

FIG. 7 is a circuit diagram which shows the internal configuration of the first synchronization delay circuit 100A. The detection delay circuit chain 101A and the transfer delay circuit chain 102A have the configuration of alternately arranged dual-input NAND circuits and inverters, and the control circuit 103A and the load adjustment element 104A have the configuration of an arrangement of dual-input NAND circuits. Specifically, the detection delay circuit chain 101A has a configuration that is the cascaded connection, starting at the input side, of a NAND circuit FN1, an inverter FI1, an NAND circuit FN2, an inverter FI2, . . . , a NAND circuit FNn, and inverter FIn, and finally a NAND circuit FNn+1, an inverter FINn+1, and NAND gate FNn+2, while the transfer delay circuit chain 102A has a configuration that is the cascaded connection, starting from the output side, of an inverter RI1, a NAND circuit RN1, an inverter RI2, a NAND gate RN2, . . . , an inverter RIn, a NAND circuit RNn, an inverter RIn+1, and finally a NAND circuit RNn+1. The control circuit 103A is formed by a chain of NAND circuits CN1, CN2, . . . , CNn, and CNn+1, one input of each being connected to the control signal line 109A, and the load adjustment element 104A is formed by a chain of NAND circuits GN1, GN2, . . . , GNn, GNn+1, one input of each being connected to the ground line 110.

Next, the interconnections between the detection delay circuit chain 101A, the transfer delay circuit chain 102A, the control circuit 103A, and the load adjustment element 104A will be described for the n-th stage gate of each.

The output terminal of the inverter FIn of the detection delay circuit chain 101A is connected to one of the input terminals of the NAND circuit FNn+1, and also to the input terminal of the NAND circuit CNn of the control circuit 103A that is not connected to the control signal line 109A. The output terminal of the NAND circuit CNn of the control circuit 103A is connected to the input terminal of the NAND circuit FNn+2 of the detection delay circuit chain 101A that is not connected to the output terminal of the inverter FIn+1, and is also connected to the input terminal of the transfer delay circuit 102A that is not connected to the output terminal of the inverter RIn+1. The output terminal of the NAND circuit RNn of the transfer delay circuit chain 102A is connected to the input terminal of the inverter RIn of the transfer delay circuit chain 102A.

The output terminal of the inverter RIn of the transfer delay circuit chain 102A is connected to the input terminal of the NAND circuit RNn−1 that is not connected to the output terminal of the NAND circuit CNn−1, and is also connected to the input terminal of the NAND circuit GNn of the load adjustment element 104A that is not connected to the ground line 110. The output terminal of the NAND circuit GNn of the load adjustment element 104A is left in the open condition. To one input terminal of the NAND circuit FN1 first stage of the detection delay circuit chain 101A is connected the output terminal of the input delay circuit 101AA, the output terminal of the inverter RI1 last stage of the transfer delay circuit chain 102A being connected to the input terminal of the output delay circuit 102AA. The input terminals of the first stage and the second stage NAND circuits FIN1 and FN2 of the detection delay circuit chain 101A that are not connected to the input delay circuit 101AA output or to the output terminal of the inverter FI1 of the detection delay circuit chain 101A, and the input terminal of the first NAND circuit stage of the transfer delay circuit chain 102A (at the right edge of the drawing) that is not connected to the output terminal of the final NAND circuit stage of the detection delay circuit chain 101A (at the right edge of the drawing) are connected to power supply line 111.

Next, the operation of the above-described synchronization delay circuit will be described in detail.

FIG. 8 is a waveform diagram which shows the signal waveforms at various parts of the circuit. To simplify this description, it will be assumed that the delay times of the input delay circuit 101AA and the output delay circuit 102AA are zero. The clock 201 is an external clock that is input to the receiving circuit 105, this being a pulse of fixed period which uses the rising edge. The clock group 202 represents the output waveforms of all of the inverters within the detection delay circuit chain 101A that make a high-level output. The clock 203 is an output clock from the receiving circuit 105, this being input to the control signal line 109A, and also to the first delay circuit 107. The clock group 204 represents the output waveforms of all inverters within transfer delay circuit chain 102A. The clock 205 is the output signal from the amplifier circuit 106. (The output signal of the amplifier circuit 106 is interpolated with an output signal from the second synchronization delay circuit 100B and is therefore not the waveform as illustrated. However, for the purpose of simplifying this description, it shall be assumed that waveform shown is the signal waveform for the case in which the delay time of the interpolating circuit is negligible, and further in which the output signal of the first synchronization delay circuit 100A is independently output without being interpolated.) The clock that is output from the amplifier circuit 106 is used, for example, as an internal clock of an DRAM device.

Because a clock is a periodically changing signal pulse, while there is no distinction in actual use, to make the operation easy to understand, an arbitrary clock signal pulse will be called the m-th clock signal pulse, the next clock signal pulse will be called the (m+1)-th clock signal pulse, and the next clock signal pulse will be called the (m+2)-th clock signal pulse.

The delay time of the first delay circuit 107 is set to the delay time d1 of the receiving circuit 105, and the delay time of the second delay circuit 108 is set to the delay time d2 of the amplifier circuit 106. The period of the external clock that is input will be taken to be tCK.

When the detection delay circuit chain 101A and the transfer delay circuit chain 102A are in the reset condition (the condition occurring when the clock that is input to the detection delay circuit chain 101A is maintained for a given amount of time at the low level), the outputs of the inverters FI1, FI2, and so on of the detection delay circuit chain 101A are at the low level, and the outputs of the inverters RI1, RI2, and so on of the transfer delay circuit chain 102A are at the high level.

Upon receiving the m-th clock signal pulse of the clock 201, after the delay time of d1, the receiving circuit 105 outputs the m-th clock signal pulse indicated by the clock 203. This pulse is input to the detection delay circuit chain 101A via the first delay circuit 107, the second delay circuit 108, and the input delay circuit 101AA, and proceeds within the detection delay circuit chain 101A. The m-th clock signal pulse which proceeds within the detection delay circuit chain 101A is expressed as the m-th clock signal pulse group within the clock group 202. The inverter outputs within the detection delay circuit chain 101A are changed to the high level by means of the procession of the m-th clock signal pulse, this being maintained for the high-level for the period of the m-th clock signal pulse. When the high-level period of the m-th clock signal pulse ends and the clock that is input to the detection delay circuit chain 101A changes to low level, this low level proceeds within the detection delay circuit chain 101A. In this condition, there is procession of a high-level signal and a low-level signal within the detection delay circuit chain 101A.

After the m-th clock signal pulse 203 is output from the receiving circuit 105, when one clock period tCK has elapsed, the (m+1)-th clock signal pulse of the clock 203 is input to the control signal line 109A from the receiving circuit 105. When this happens, the m-th clock signal pulse proceeds within the detection delay circuit chain 101A. For example, if this procession is moving from the j−th inverter FIj to the (j−k)-th inverter FIj−k within the detection delay circuit chain 101A, the outputs of the inverters FIj through FIj−k are in the high-level condition. Therefore, both of the inputs to the NAND circuits CNj through CNj−k of the control circuit 103A which are connected to the output terminals of the inverters FIj through FIj−k through which the m-th clock signal pulse is proceeding are at the high level, so that their outputs are at the low level.

Immediately before this, both of the inputs of the NAND circuits within the transfer delay circuit chain 102A are waiting at the high level, and of these one of the two inputs of the NAND circuits RNj through RNj−k in the transfer delay circuit chain 102A, which are connected to the output terminals of the NAND circuits CNj through CNj−k of the control circuit 103A goes to the low level, the outputs of the NAND circuits RNj through RNj−k changing from the low level to the high level, and the output of the inverters RIj through RIj−k changing from the high level to the low level. When the (m+1)th clock signal pulse of the clock 203 is input to the control signal line 109A, a low-level signal is proceeding through the 1st through (j−k−1)th inverters FI1 through FIj−k−1 in the detection delay circuit chain 101A, the output of the 1st through the (j−k−1)th NAND circuits CN1 through CNj−k−1 being maintained at a high level even if the control signal line 109A level is high, this resulting in the NAND circuits RN1 through RNj−k−1 and the inverters RI1 through RIj−k−1 of the transfer delay circuit chain 102A being maintained at low level and high level, respectively.

The low-level signal which is transferred to the transfer delay circuit chain 102A because of the input of the (m+1)th clock signal pulse to the control signal line 109A starts to be propagated immediately, and passing through the transfer delay circuit chain 102A at a speed according to the delay time of each of the gates in the transfer delay circuit chain 102A and is then output. The low-level pulse that proceeds through the transfer delay circuit chain 102A is represented by the m-th clock pulse signal of the clock group 204.

When the (m+1)th clock signal pulse is input to the control signal line 109A, of the two input terminals to the NAND circuits FNj+2 through FNj-k+2 in the detection delay circuit chain 101A, the input terminal that is connected to the output terminals of the NAND circuits CNj through CNj-k of the control circuit 103A changes to the low level, this resulting in all outputs of the inverters FIj+2 through FIj-k+2 changing to the low level. During this time, the outputs of the inverters FIj and FIj+1 are at a low level because of the low-level signal that is proceeding through the detection delay circuit chain 101A, the m-th clock signal pulse within the detection delay circuit chain 101A being reset. The m-th clock signal pulse that is output from the transfer delay circuit chain 102A is inverted as it passes through the output delay circuit 102AA, the interpolating circuit 100C, and the amplifier circuit 106, and is output as a high-level signal. This pulse is represented by the m-th clock signal pulse of the clock 205.

When the low-level m-th clock signal pulse is output from the transfer delay circuit chain 102A, the transfer delay circuit chain 102A returns to the reset condition. After the (m+1)th clock signal pulse from the receiving circuit 105 is output, when the time d1+d2 elapses, the (m+1)th clock signal pulse is input to the detection delay circuit chain 101A, and the next cycle begins.

Next, the delay time of the above-noted synchronization delay circuit will be described in detail. The delay time between the rising edge of the m-th clock signal pulse of the clock 101 and the rising edge of the m-th clock signal pulse of the clock 203 that is output by the receiving circuit 105 is the time d1. The delay time from the time of the rising edge of the m-th clock signal pulse of the clock 203 until the leading clock pulse of the clock group 202 starts propagating through the detection delay circuit chain 101A is the time d1+d2. The time that elapses from the rising edge of the m-th clock signal pulse of the clock 203 that is output by the receiving circuit 105 until the m-th clock signal pulse group of the clock group 202 that is propagating through the detection delay circuit chain 101A returns to the reset condition, is the clock period, tCK. Therefore, the time of propagation of the head of the m-th clock signal pulse through the detection delay circuit chain 101A is tCK−d1−d2. Because the delay path of the rising edge of the low-level pulse clock signal that propagates through the transfer delay circuit chain 102A is configured to have the same number of stages as the rising edge of the clock signal that propagated through the detection delay circuit chain 101A, the time of propagation of the rising edge of the low-level pulse of the clock signal through the transfer delay circuit chain 102A is equal to the time for the rising edge of the clock to propagate through the detection delay circuit chain 101A, this being tCK−d1−d2. The delay time difference between the rising edge of the m-th clock signal pulse 204 of the transfer delay circuit chain 102A and the rising edge of the m-th clock signal pulse 205 is the time d2 required to pass through the amplifier circuit 106.

From the above, the amount of time required for a clock signal to pass through the receiving circuit 105, the first delay circuit 107, the second delay circuit 108, the detection delay circuit chain 101A, the transfer delay circuit chain 102A, and the amplifier circuit 106 is nominally 2tCK, and if the delay time tdF of the NAND circuit FNi and inverter FIi and the delay time tdR of the NAND circuit RNi and inverter RIi are ignored, the m-th clock signal pulse is output to an internal circuit with a timing that is equal to that of the (m+2)th clock signal pulse of the clock 201.

Next, the dependency in a synchronization delay circuit according to the prior art on the external clock signal cycle of the delay time difference between the external clock signal (the (m+2)th clock signal pulse 201) and the internal clock signal (the output of the m-th clock signal pulse 205 from the amplifier circuit 106) will be described.

If the dependency in the first synchronization delay circuit 100A on the external clock signal cycle of the delay time difference between the external clock signal (the (m+2)th clock signal pulse) and the internal clock signal (the output of the m-th clock signal pulse from the amplifier circuit 106) is considered, for the clock signal cycle in which the "m-th clock signal pulse is from the j-th inverter FIj to the (j−k)th inverter FIj−k" and the "(m+1)th clock signal pulse is input to the control signal line 109A, because the m-th clock signal pulse is "ntransferred through the NAND circuits RNj through RNj−k within the transfer delay circuit chain 102A and propagates within the transfer delay circuit chain 102A, the clock signal cycle for which is transferred to the NAND circuits RNj through RNj−k within the transfer delay circuit chain 102A has a width which is the time for the m-th clock signal to propagate from the NAND circuit FNj to the NAND circuit FNj+1, this being tdF. When the (m+1)th clock signal pulse is input to the control signal line 109A, if the (j+1)th inverter FIj+1 is in a transition state, the speed of the falling edge of the NAND circuit CNj+1 is slower than the falling edge of the NAND circuits CNj through CNj−k. For this reason, there is the possibility of the inverter FIj+1 being reset with the NAND circuit CNj+1 in the transition state, so that there is a possibility that the output of the NAND circuit CNj+1 will not be inverted. As a result, the very end of the pulse that propagates through the transfer delay circuit chain 102A is either the NAND circuit RNj+1 or the NAND circuit RNj, and the width tdR occurs at the timing of the rising edge of the m-th clock signal pulse of the clock group 204. From the above-described conditions, in the case in which output of the first synchronization delay circuit 100A is output via the amplifier circuit 106, as shown in FIG. 9(a), the dependency upon the external clock signal cycle of the time delay difference (known as jitter) between the amplifier circuit 106 output of the m-th clock signal pulse and the (m+2) external clock signal pulse exhibits a sinusoidal characteristic having a period that is the propagation time tdF from the NAND circuit FNj to the NAND circuit FNj+1 within the detection delay circuit chain 101A, and an amplitude that is approximately 60% to 70% of the propagation time from the NAND circuit RNj to the NAND circuit RNj+1.

Because of this, in the above-described prior art, a plurality of synchronization delay circuits (two in the case of the example of FIG. 6) having the same type of configuration is provided, each of the respective output signals thereof being interpolated by a interpolating circuit so as to shorten the time delay difference between the external clock and the internal clock. The interpolating of synchronization delay circuits is described below.

As described above, in the case in which the output of either the first synchronization delay circuit 100A or the second synchronization delay circuit 100B is made directly via the amplifier circuit 106, the time delay difference between the amplifier circuit 106 output of the m-th clock signal pulse and the (m+2)th external signal pulse exhibits a sinusoidal dependency upon the external clock signal cycle.

However, the first and second synchronization delay circuits 100A and 100B have the input delay circuit 101AA and output delay circuit 102AA, and the input delay circuit 101BA and output delay circuit 102BA, the delay time difference between the input delay circuit 101AA and the input delay circuit 101BA being ½ of tdF, and the delay time difference between the output delay circuit 102AA and the output delay circuit 102BA being ½ of tdR. For this reason, the respective sinusoidal dependencies on the external clock signal cycle of the first synchronization delay circuit 100A and the second synchronization delay circuit 100B, as shown in FIG. 9(b), having timings that are skewed by tdF/2. When the output delay circuit 102AA and output delay circuit 102BA outputs, which have these timings, are interpolated by the interpolating circuit 100C, it is possible not only to improve the resolution two-fold, as shown in FIG. 9(c), but also to better than halve the dependency on the external clock signal cycle of the delay time difference between the internal clock signal output and hte external clock signal pulse.

It is possible, as shown in FIG. 10, to envision a interpolating circuit 100C that is formed by the parallel-connected circuit of two p-channel MOS transistors (hereinafter referred to as PMOS transistors) P1 and P2, and the series-connected circuit of two n-channel MOS transistors (hereinafter referred to as NMOS transistors) N1 and N2 or the reverse configuration, formed by series-connected PMOS transistors and parallel-connected NMOS transistors. The interpolating circuit which is shown in FIG. 10 is capable of completely eliminating external clock dependency by completely compensating the mutual characteristics, for the case in which there are two inputs each having completely sinusoidal external clock dependencies.

As described above, the external clock signal cycle dependency of the delay time difference between the output clocks of the first and second synchronization delay circuits 100A and 100B and the external clock signal pulse exhibits a sinusoidal characteristic. As shown in FIG. 9(a) and FIG. 9(b), this is not completely sinusoidal, and exhibits a disturbance in symmetry. With the interpolating circuit which is shown in FIG. 10, the PMOS transistor P1 and the PMOS transistor P2 are generally formed to be the same size. When two signals having the external clock signal cycle dependency shown in FIG. 9(b) is input to the interpolating circuit which is shown in FIG. 10, the output signal therefrom does not exhibit complete compensation of the respective dependencies, even if the two characteristics are mutually skewed by a half wavelength, so that the delay time difference exhibits an external clock signal cycle dependency corresponding to the disturbance in symmetry, as shown in FIG. 9(c). Therefore, it is not possible to make the delay time difference dependency of clock signal on the external clock after interpolating smaller than approximately tdR/5 to tdR/3.

In view of the above-described drawbacks in the prior art, an object of the present invention is to provide a interpolating circuit that is capable of making the delay time dependency on the external clock of the internal clock that is output smaller.

SUMMARY OF THE INVENTION

To achieve the above-noted object, the present invention provides a signal interpolating circuit which has a parallel-connected element having a plurality of MOS transistors of a first conductivity type, one of the terminals of said transistors being connected to a first power supply, the other terminal of said transistors being connected to an output terminal, and the gates of said transistors being connected to mutually different input terminals, respectively, and, a first series-connected element A having a plurality of MOS transistor of a second conductivity type, one of the terminals of said transistors being connected to a second power supply, the other terminals of said transistor being connected to said output terminal, and the gates of said transistors being connected respectively to said input terminals, one or more separate series-connected elements each having a plurality of MOS transistor, one of the ends of which is connected to said first power supply, the other ends of which is connected to the above-noted output terminal, and the gates of each one of said MOS transistors is connected respectively to the above-noted input terminals.

DETAILED DESCRIPTION OF THE PREFERRED EMBODIMENTS

Figure 1:
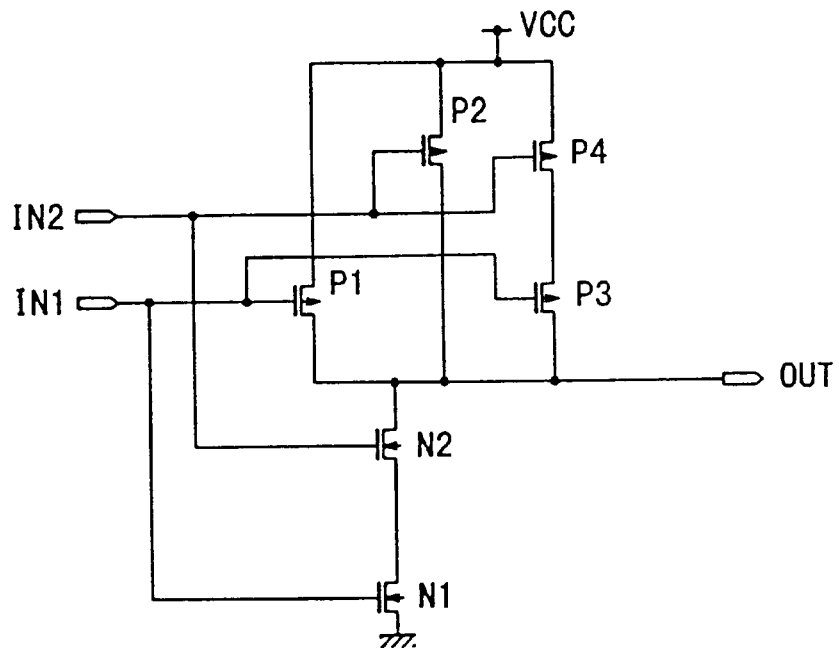
FIG. 1 is a circuit diagram which illustrates the first embodiment of the present invention.
Figure 10:
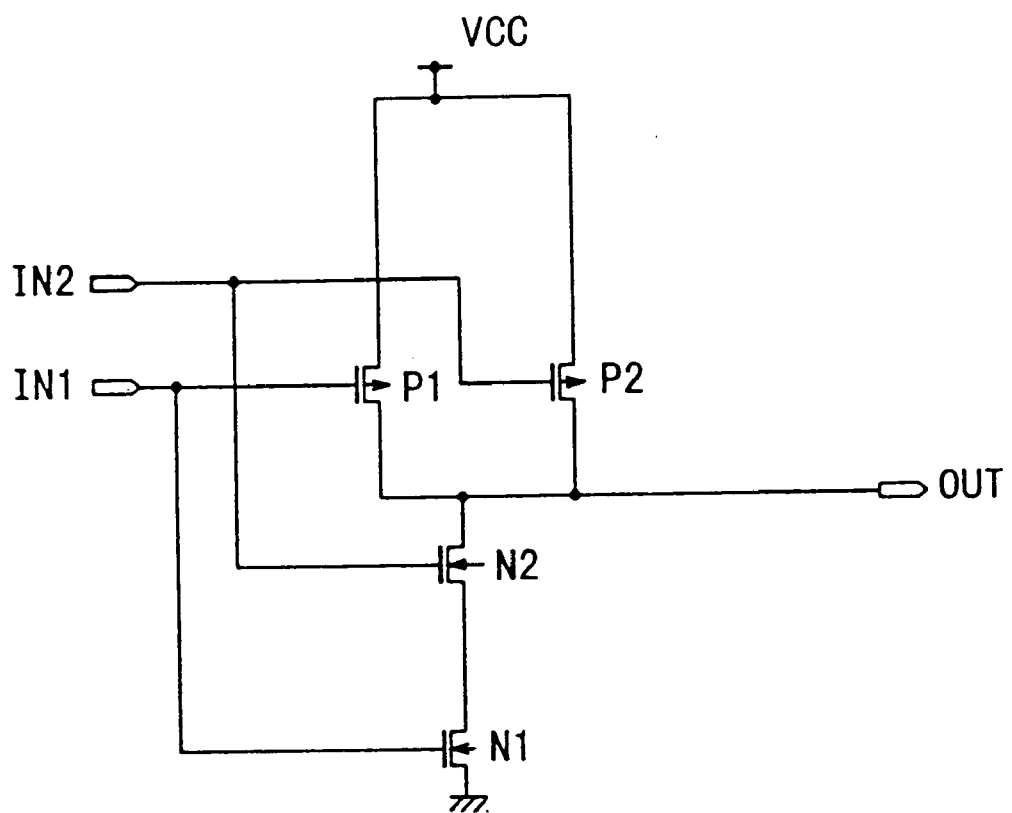
FIG. 10 is a circuit diagram which shows an example of a interpolating circuit which is used in the circuit which is shown in FIG. 6.

FIG. 1 is a circuit diagram which shows the form of the first embodiment of the present invention. In contrast the prior art circuit shown in FIG. 10, in which there is a parallel-connected circuit of a first PMOS transistor P1 having its gate connected to a first input terminal IN1 and a second PMOS transistor P2 having its gate connected to a second input terminal IN2, and a first series-connected circuit of a first NMOS transistor N1 having its gate connected to the first input terminal IN1 and a second NMOS transistor N2 having its gate connected to the second input terminal IN2, in the circuit which is shown I FIG. 1, and there is a second series-connected circuit of a third PMOS transistor P3 having its gate connected to the first input terminal IN1 and a fourth PMOS transistor P4 having its gate connected to the second input terminal IN2, which is disposed between the first power supply and output terminal, this being connected in parallel with the parallel-connected circuit of the first PMOS transistor P1 and the second IPMOS transistor P2. This circuit is used as the interpolator for L pulse 204.

It is possible to make the following changes to the circuit which is shown in FIG. 1.

<1>Connect in parallel to the series-connected circuit of the first NMOS transistor N1 and the second NMOS transistor N2 a series-connected circuit of the third NMOS transistor having its gate connected to the second input terminal IN2 and the fourth NMOS transistor having its gate connected to the first input terminal IN1, this circuit having the third NMOS transistor as the ground side.

<2>Connect in parallel to the series-connected circuit of the third PMOS transistor P3 and the fourth PMOS transistor P4 a series-connected circuit of a fifth PMOS transistor P5 having its gate connected to the second input terminal IN2 and a sixth PMOS transistor P6 having its gate connected to the first input terminal IN1, this circuit having the sixth PMOS transistor as the power supply side.

<3>Replace the third PMOS transistor P3 and the fourth PMOS transistor P4 of the circuit in FIG. 1 or part of the third through the sixth PMOS transistors of a circuit modified as described in <2>above with an NMOS transistor (excluding the case of replacing all of the PMOS transistors within the same series-connected circuit with NMOS transistors).

<4>For the purpose of enabling interpolating of a larger number of input signals, connect the required number of PMOS transistors in parallel with the first PMOS transistor P1 and the second PMOS transistor P2, and also connect NMOS transistors connected to the input terminals in common with the gates of the newly added PMOS transistors in parallel with the first and the second NMOS transistors N1 and N2.

<5>Connect in series with the first PMOS transistor P1 and the second PMOS transistor P2 an impedance element for the purpose of adjusting the current flowing in each of the respective transistors.

Figure 2:
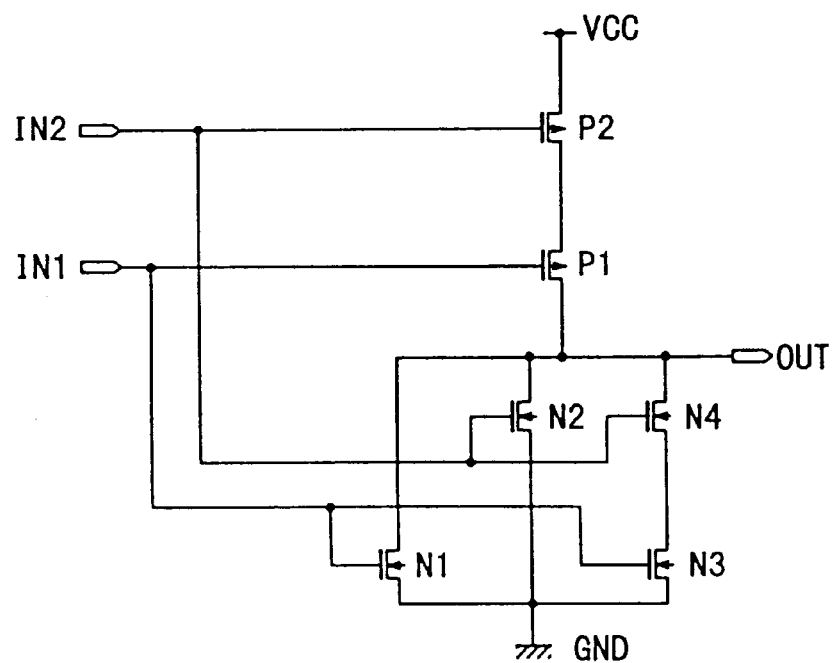
FIG. 2 is a circuit diagram which illustrates the second embodiment of the present invention.

FIG. 2 is a circuit diagram which shows the second embodiment of the present invention. In this circuit, with respect to a parallel-connected circuit of the first NMOS transistor N1 having its gate connected to the first input terminal IN1 and the second NMOS transistor N2 having its gate connected to the second input terminal IN2 and a series-connected circuit of the first PMOS transistor P1 having its gate connected to the first input terminal IN1 and the second PMOS transistor P2 having its gate connected to the second input terminal IN2, between the output terminal and the ground terminal which is the second power supply, there is the series-connected circuit of the third NMOS transistor N3 having its gate connected to the first input terminal IN1 and the fourth NMOS transistor N4 having its gate connected to the second input terminal IN2. This circuit is used in interpolating H pulses 202.

The changes <1>through <5>can be added, with the change of conductivity type, to the circuit which is shown in FIG. 2 as well.

The individual embodiments of the present invention will now be described, with reference being made to the relevant accompanying drawings.

Figure 3:
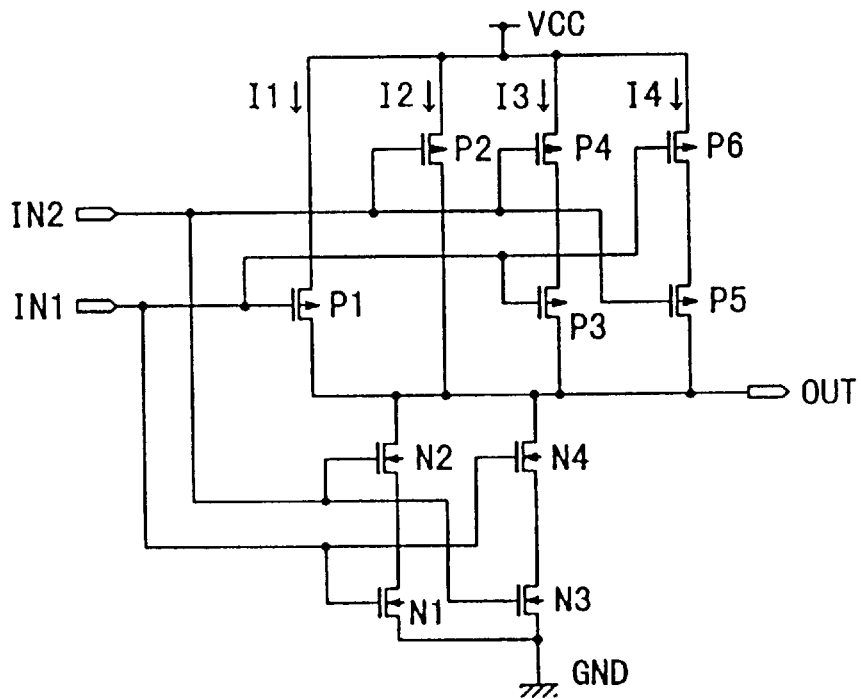
FIG. 3 is a circuit diagram which illustrates the third embodiment of the present invention.

FIG. 3 is a circuit diagram which shows the third embodiment of the present invention. In this embodiment, between the ground terminal and the output terminal OUT, a series-connected circuit of the NMOS transistors N1 and N2 and a series-connected circuit of the NMOS transistors N3 and N4 are disposed in the opposite sequence of the input signals, so that characteristics in the sequence of the input do not occur. That is, the gates N1 and N4 are connected to the first input terminal IN1, and the gates N2 and N3 are connected to the input terminal IN2. Between the output terminal OUT and the power supply terminal, there is the parallel connection of the PMOS transistor P1 having its gate connected to the first input terminal IN1, the PMOS transistor P2 having its gate connected to the second input terminal IN2, the series-connected circuit of the PMOS transistor having its gate connected to the first input terminal IN and the PMOS transistor P4 having its gate connected to the second input terminal IN2, and the series-connected circuit of the PMOS transistor P5 having its gate connected to the second input terminal IN2 and the PMOS transistor P6 having its gate connected to the first input terminal IN1.

The circuit of this third embodiment is used in interpolating low-level pulses. Therefore, the operation of this circuit that is important is that which occurs from the condition in which a high-level signal is applied to both the first input terminal IN1 and the second input terminal IN2, when at first one of these signals changes to the low level, after which the remaining signal changes to the low level. When both IN1 and IN2 are at the high level, the output node is in the discharged state. If, for example, the input terminal IN1 changes to the low level first, the NMOS transistors N1 and N4 first go into the off condition, and the PMOS transistors P1, P3, and P6 go into the conducting condition. Because the PMOS transistors P3 and P6 connected respectively to the non-conducting the PMOS transistors P4 and P5, however, current does not flow, and charging of the output node is conducted by only the current I1 flowing via the PMOS transistor P1. Then, the input terminal IN2 changes to the low level, causing the PMOS transistors P2, P4, and P5 to go into the conducting condition, so that the currents I2, I3, and I4 which are shown in FIG. 3 flow all at once via transistors P2 through P6. If the electrical charge required for the output node to reach the threshold voltage value is Q and the difference in timing between the inputs at the input terminals IN1 and IN2 is td, the charging time (delay time) T from the IN1 input until the output node reaches the threshold voltage is given by the following equation.

$$T = td + (Q - I1 \times td)/(I1 + I2 + I3 + I4) \quad (1)$$

By designing the PMOS transistors P1, P2, P3, P6, P4, and P5 so as to have the same size, I1, I2, and I3+I4 become equal current values. In this case, therefore, Equation (1) becomes.

$$T = td + (Q - I1 \times td)/3I1 = 2/3 td + Q/3I1 \quad (2)$$

Figure 6:
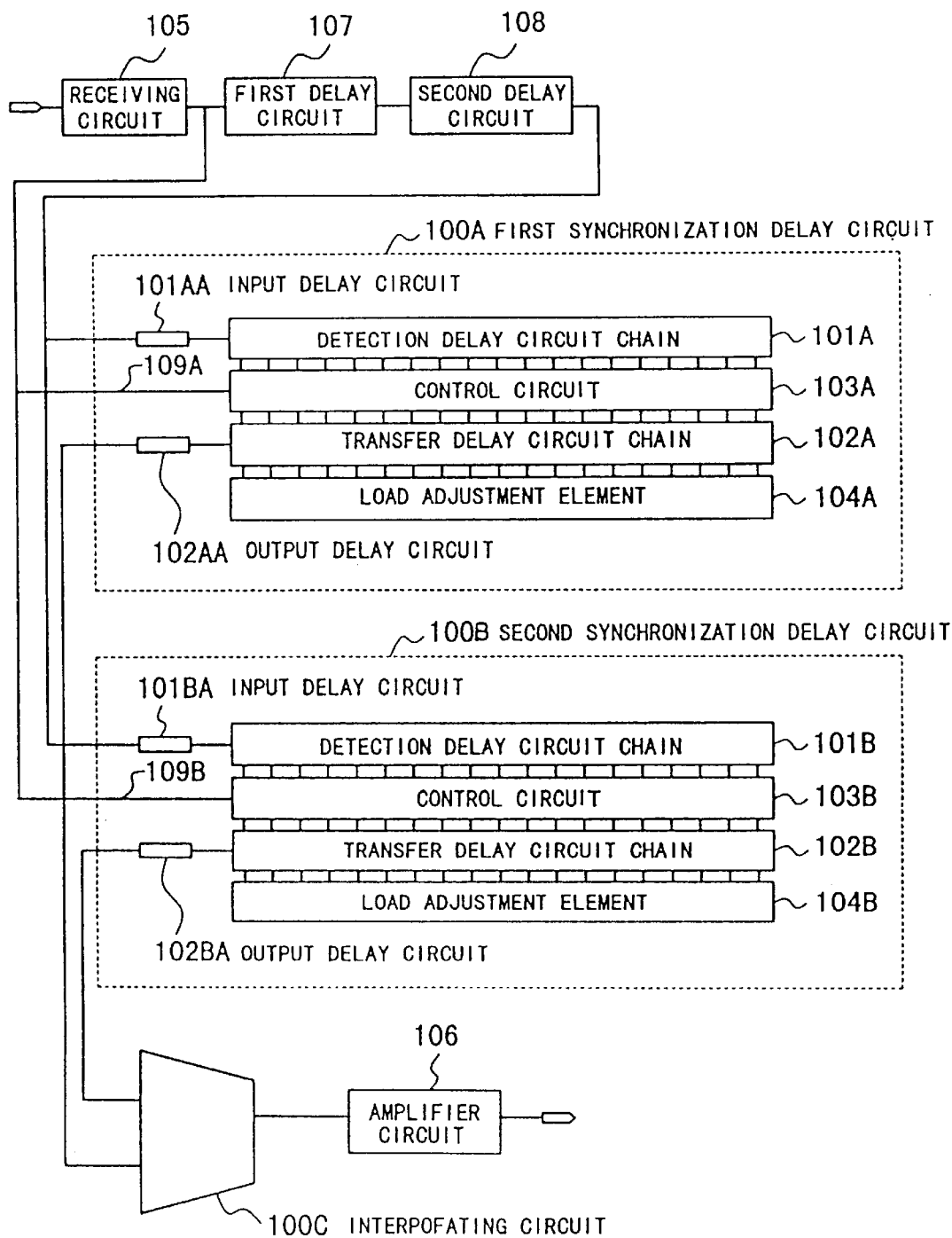
FIG. 6 is a block diagram which illustrates the prior art related to the present invention.
Figure 7:
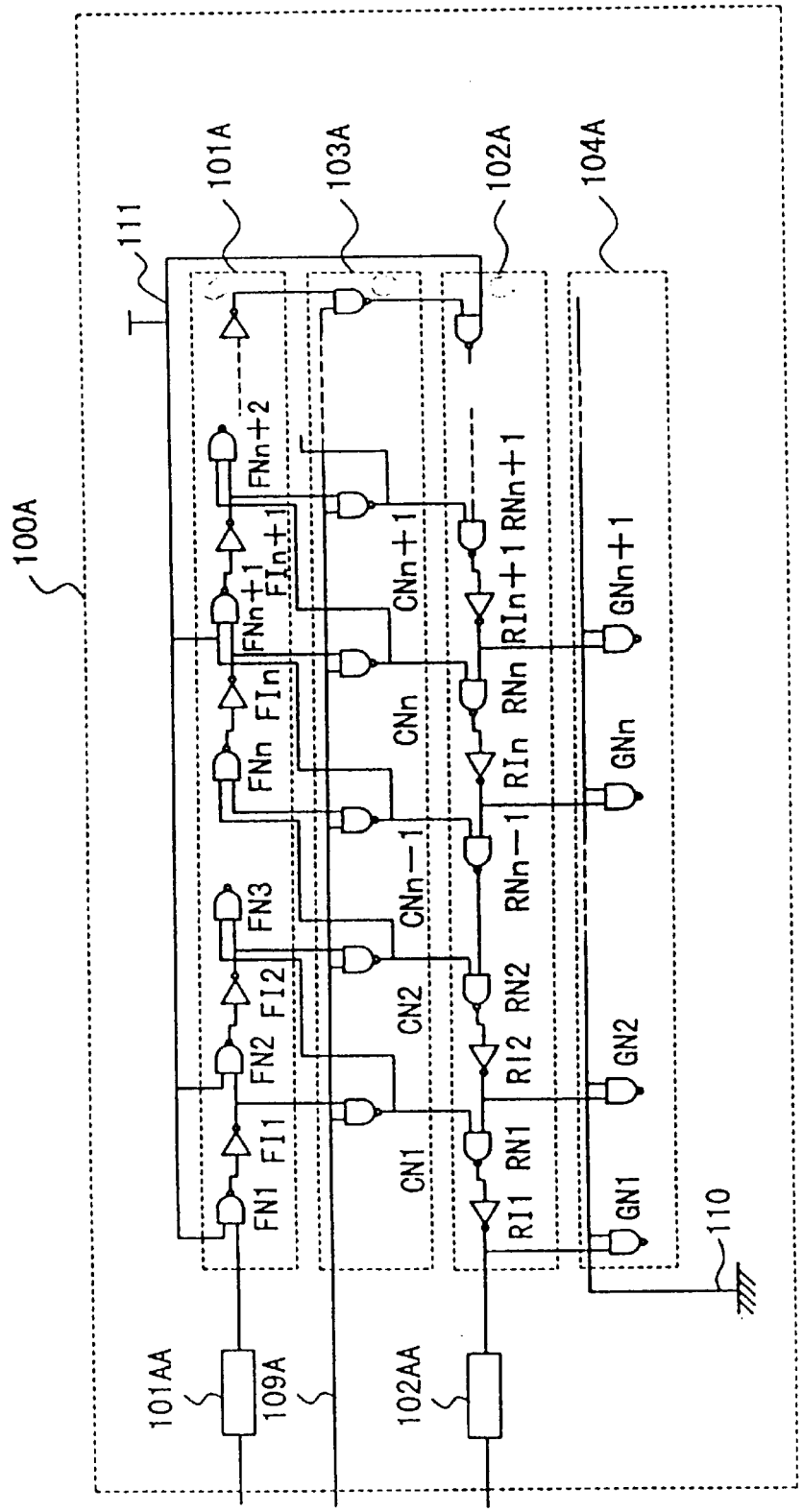
FIG. 7 is a partial detailed circuit diagram of the circuit which is shown in FIG. 6.
Figure 8:
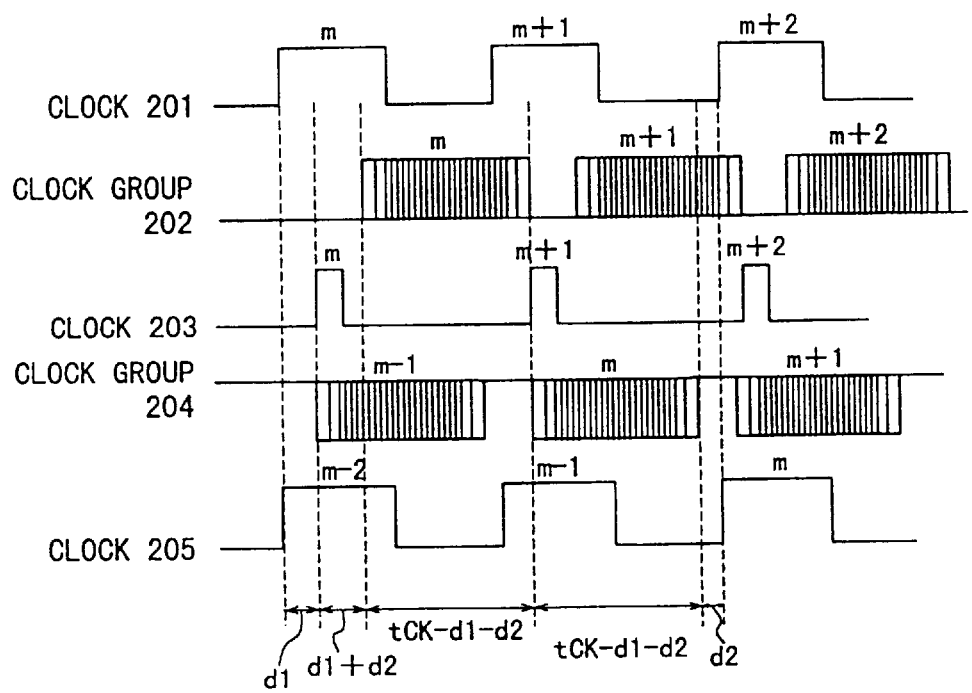
FIG. 8 is a diagram of pulse waveforms at various parts which illustrates the operation of the circuit which is shown in FIG. 6.
Figure 9:
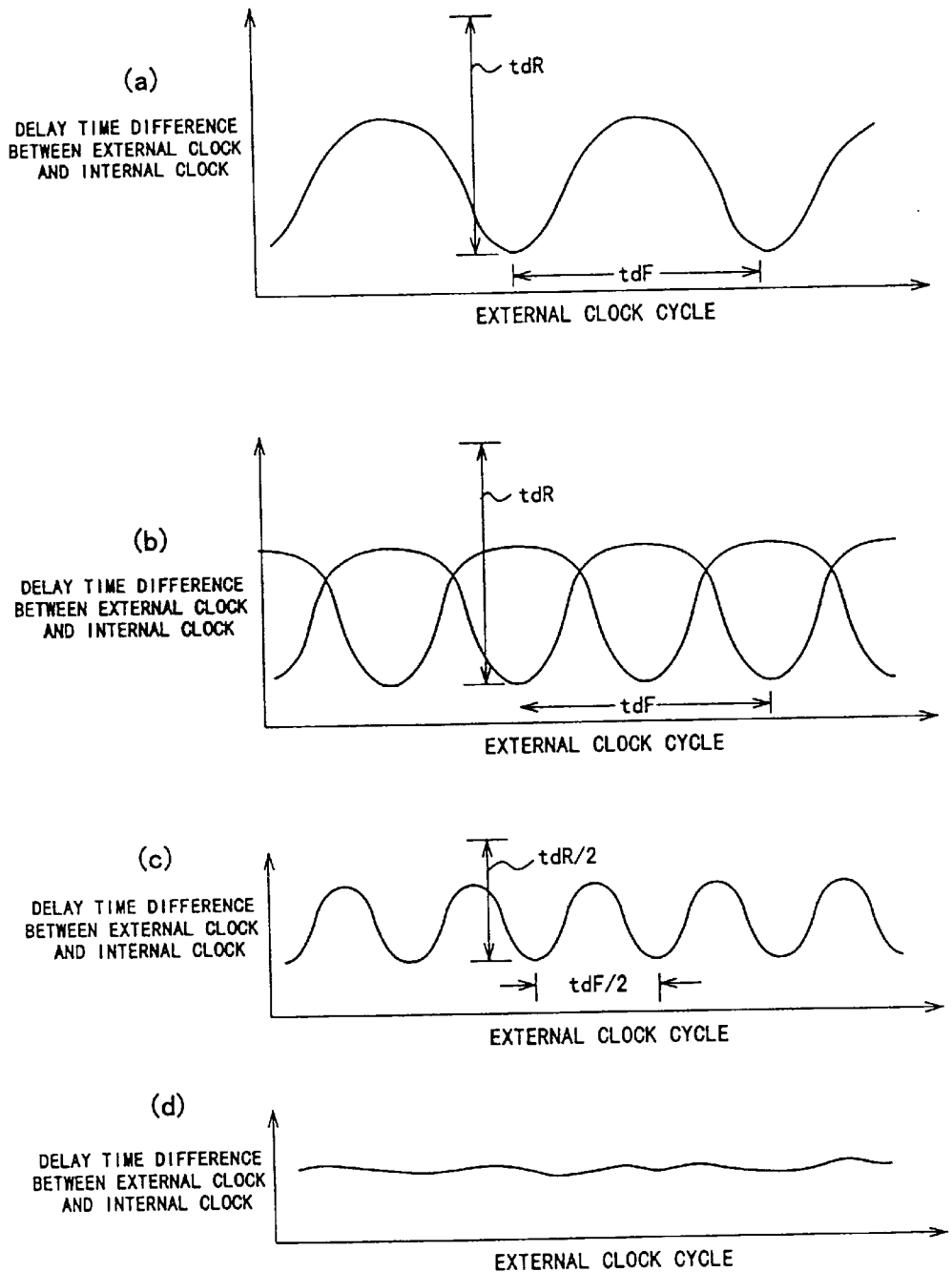
FIG. 9 is a graph which show the relationship between the external clock period and the delay time difference between the external and internal clocks.

As can be seen from Equation (2), while the delay time T is proportional to the input time difference td, the associated constant of proportionality is established by the PMOS transistor size ratio and is constant regardless of the input sequence. When this interpolating circuit is used in circuit 100C in the synchronization delay circuit which is shown in FIG. 6, by appropriately establishing this constant of proportionality, it is possible to absorb the skew from a sinusoidal delay characteristic of each internal clock with respect to the external clock, as shown in FIG. 9(b), enabling achievement of a signal which exhibits almost no dependence on external clock signal cycle of the delay time with respect to the external clock.

Figure 4:
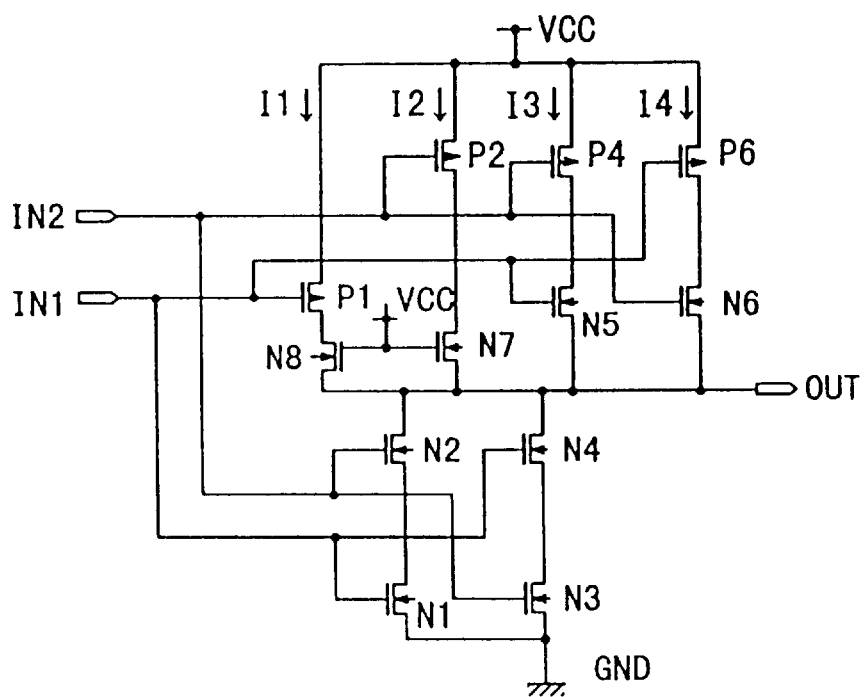
FIG. 4 is a circuit diagram which illustrates the fourth embodiment of the present invention.

FIG. 4 is a circuit diagram which shows the fourth embodiment of the present invention. The circuit of this embodiment is similar to the circuit of the above-described first embodiment, the difference with respect to the circuit of FIG. 3 being the connection of the NMOS transistors N5 and N6 instead of the PMOS transistors P3 and P5 of FIG. 1. Additionally, the NMOS transistors N7 and N8, which are always in the on condition, are connected in series with the PMOS transistors P1 and P2.

The circuit of the fourth embodiment is also used in the interpolating of L pulses. Therefore, the operation of this circuit that is important is that which occurs from the condition in which a high-level signal is applied to both the first input terminal IN1 and the second input terminal IN2, when at first one of these signals changes to the low level, after which the remaining signal changes to the low level. If, for example, the input terminal IN1 changes to the low level first, the NMOS transistors N1 and N4 first go into the non-conducting condition, the PMOS transistors P1 and P6 go into the conducting condition, and the NMOS transistor N5 goes into the non-conducting condition, therefore charging of the output node is conducted by only the current I1 flowing via the PMOS transistor P1 and the current I4 flowing via the PMOS transistor P6 and the NMOS transistor N6. Then, the input terminal IN2 changes to the low level, causing the PMOS transistors P2, P4 to go into the conducting condition, the NMOS transistor N6 to go into the non-conducting condition, so that current I4 being cut off, with both I2 and I1 flowing. If the electrical charge required for the output node to reach the threshold voltage value is Q and the difference in timing between the inputs at the input terminals IN1 and IN2 is td, the charging time from the IN1 input until the output node reaches the threshold voltage is given by the following equation.

$$T = td + (Q - (I1+I4) \times td)/(I1+I2) \quad (3)$$

By designing the PMOS transistors P6 and P4 so that they are ½ the size of PMOS transistors P1 and P2, and designing NMOS transistors N5 and N6 so that they are ½ the size of NMOS transistors N7 and N8, the currents I3 and I4 are ½ of the currents I1 and I2, respectively. In this case, therefore, Equation (3) yields the following equation.

$$T = td + (Q - 3I1 \times d/2)/2I1 \quad (4)$$
$$= 1/4 td + Q/2I1$$

That is, while the delay time T is proportional to the input time difference td, the associated constant of proportionality is established by the PMOS transistor size ratio, and is constant regardless of the input sequence. It is possible to apply this embodiment to a circuit which requires that the constant of proportionality be made smaller than ½, and this can be used as an alternate to the circuit of the third embodiment, which is used in a circuit requiring that this constant be made greater than ½, depending upon the circumstances.

Figure 5:
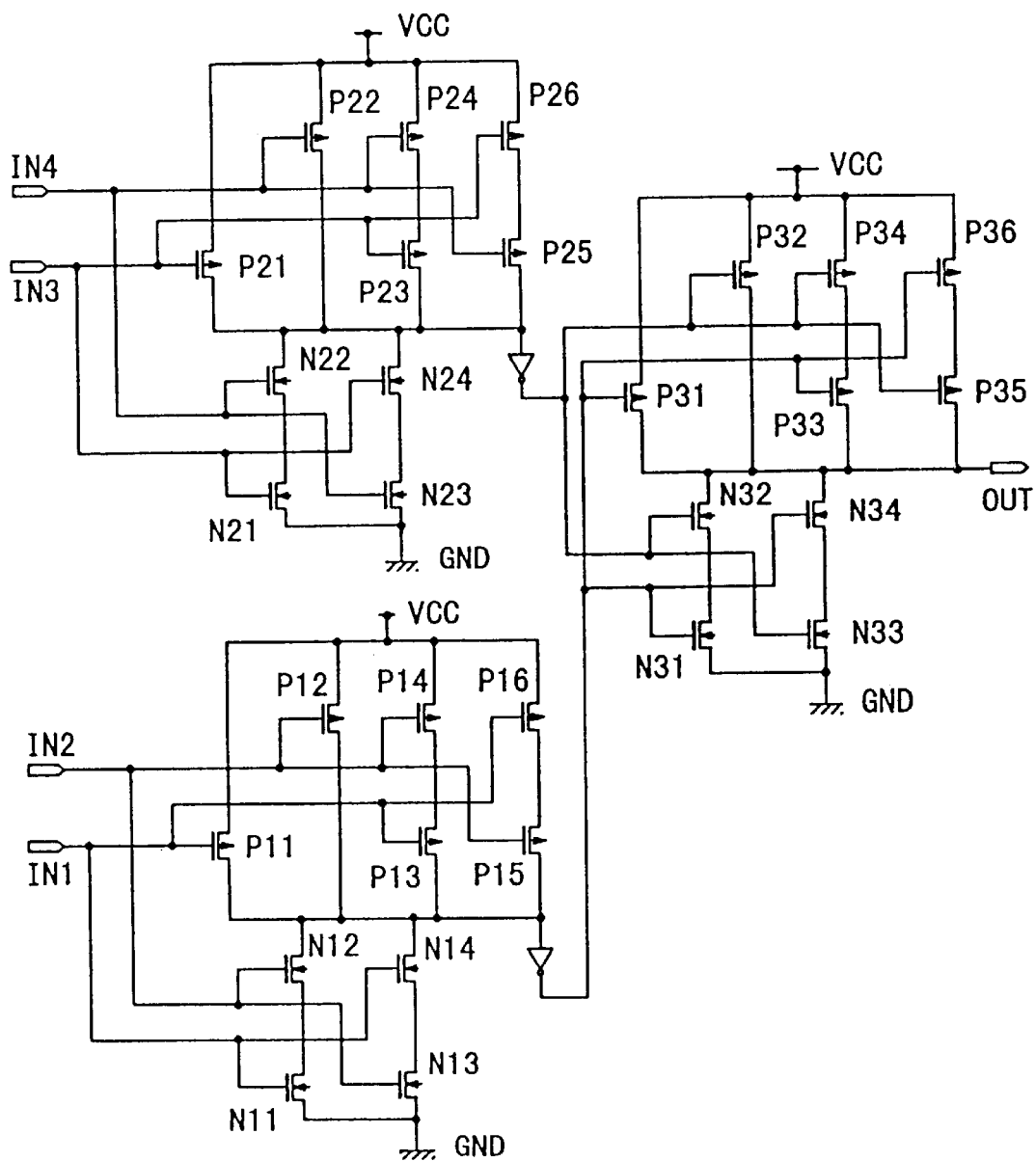
FIG. 5 is a circuit diagram which illustrates the fifth embodiment of the present invention.

FIG. 5 is a circuit diagram which shows the fifth embodiment of the present invention. This embodiment is a circuit for the purpose of interpolating four input signals, and is provided for the purpose of interpolating four output signals that are obtained in the case in which third and fourth synchronization delay circuits are added to the synchronization delay circuit that is shown in FIG. 6. The circuit of this embodiment has a parallel arrangement of two interpolating circuits having the same configuration as the circuit of the first embodiment, the output signals obtained from each of these interpolating circuits being further interpolated by another interpolating circuit having the same configuration as the circuit of the third embodiment, and in this circuit diagram the last digit of reference symbols having the same function as transistors in the circuit of FIG. 3 are assigned a common value. In the circuit of this embodiment, the first and second signals are input to the first and second input terminals INS and IN2, and the third and fourth signals are input to the third and fourth input terminals IN3 and IN4, these signals being interpolated, the output signals obtained from the respective interpolating circuits being further interpolated by the next interpolating circuit stage.

According to this interpolating circuit, it is possible to obtain a clock pulse that has even less phase shift with respect to the external clock than with the third and fourth embodiment.

According to the present invention, a interpolating circuit is provided that is capable of adjusting the output timing by selecting an appropriate constant of proportionality with respect to the input time difference, without regard to the input sequence. By using a interpolating circuit according to the present invention in the application of synchronization delay output signals having different timing that are derived from an external clock, it is possible to obtain a clock signal that has little phase error with respect to the external clock.

What is claimed is:

1. An interpolating circuit comprising:

a parallel-connected element having a plurality of MOS transistors of a first conductivity type, one of the terminals of said transistors being connected to a first power supply, the other terminal of said transistors being connected to an output terminal, and the gates of said transistors being connected to mutually different input terminals, respectively, and, a first series-connected element having a plurality of MOS transistor of a second conductivity type, one of the terminals of said transistors being connected to a second power supply, the other terminals of said transistor being connected to said output terminal, and the gates of said transistors being connected respectively to said input terminals, one or more separate series-connected elements each having a plurality of MOS transistor, one of the ends of which is connected to said first power supply, the other ends of which is connected to the above-noted output terminal, and the gates of each one of said MOS transistors is connected respectively to the above-noted input terminals.

2. An interpolating circuit according to claim 1, wherein said MOS transistors forming said separate series-connected elements comprising said first conductivity type MOS transistors.

3. An interpolating circuit according to claim 1, wherein said MOS transistors forming said separate series-connected elements comprising said first conductivity type MOS transistor and second conductivity type MOS transistor.

4. An interpolating circuit according to claim 1, wherein each of gate of said MOS transistors of one of said seperete series-connected elements, in a series-connection sequence is connected to the respective input terminals with regard to a connection sequence which is different from that of another separate series-connected element.

5. An interpolating circuit according to claim 1, wherein said seperete series-connected element of MOS transistors of the second conductivity type is parallely connected to said first series-connected element wherein each one of the gates of said seperete series-connected element is connected to the respective input terminals in a connection sequence which is different from the connection sequence of the first series-connected element.

6. An interpolating circuit according to claim 1, wherein an impedance element is connected in series to each of the MOS transistors of the first conductivity type for the purpose of adjusting a current flowing through therethrough.

7. A corrected signal interpolating circuit, which comprises a plurality of signal interpolating circuits as claimed in claim 1, wherein said interpolating circuits are parallely arranged to each other and an output of the respective signal interpolating circuit being connected to an input of the separate signal interpolating circuit.

8. A corrected signal interpolating circuit, which comprises a plurality of signal interpolating circuits as claimed in claim 3, wherein said interpolating circuits are parallely arranged to each other and an output of the respective signal interpolating circuit being connected to an input of the separate signal interpolating circuit.

9. A corrected signal interpolating circuit, which comprises a plurality of signal interpolating circuits as claimed in claim 4, wherein said interpolating circuits are parallely arranged to each other and an output of the respective signal interpolating circuit being connected to an input of the separate signal interpolating circuit.

* * * * *